INVENTOR
Lothar Gohm

BY Spencer & Kaye
ATTORNEYS

INVENTOR
Lothar Gohm

BY *Spencer & Kaye*

ATTORNEYS

Inventor
Lothar Gohm

By Spencer & Kaye

Attorneys

United States Patent Office 3,256,490

Patented June 14, 1966

3,256,490

PUSH-PULL TRANSISTOR AMPLIFIER PROVIDED WITH COMBINED CURRENT AND VOLTAGE NEGATIVE FEEDBACK

Lothar Gohm, Backnang, Wurttemberg, Germany, assignor to Telefunken Patentverwertungs-G.m.b.H., Ulm (Danube), Germany Filed Aug. 20, 1963, Ser. No. 303,317
Claims priority, application Germany, Aug. 22, 1962, T 22,628
13 Claims. (Cl. 330—15)

The present invention relates to a push-pull transistor amplifier, particularly to a high quality transistor push-pull amplifier for use as a line amplifier or so-called repeater for carrier frequency communication systems, which amplifier is provided with a combined current and voltage negative feedback. As is described in "Fernmeldetechnische Zeitschrift," 1954, No. 7, pages 362–370, this type of negative feedback makes it possible to change the amplification by changing the degree of feedback, without such change affecting the matching with respect to the load resistance.

A conventional push-pull amplifier can not be provided with such a combined negative feedback because there is no branch through which flow, while in proper phase relationship, the two output currents of the two transistors forming part of the push-pull circuit.

A known push-pull amplifier circuit specially designed for this purpose and intended for Class A operation (cf., Transitron, Transistor Datenblatt B–3–56) is shown in FIGURE 1. The circuit comprises a conventional preamplifier $A_1$ which amplifies the alternating input voltage $V_1$ by a factor $a$ so as to apply the thus-amplified output voltage $aV_1$ to the primary winding 1 of the push-pull input transformer $U_1$. The two secondary windings 2 and 3 of this transformer are connected to the input circuits of two transistors $T_1$ and $T_2$ of the amplifier output stage, the two transistors being connected in ground-emitter configuration, i.e., the emitter of each transistor is common to the input and output circuits of each respective transistor. The emitter-collector paths of the two transistors are connected with each other in a series circuit through which direct current can flow. The resistors $R_{E1}$ and $R_{E2}$ in the respective emitter branches produce a negative feedback for each respective transistor. The operating point of the transistors is determined by means of a voltage divider incorporating three resistors $R_4$, $R_5$, $R_6$, which form a series circuit connected across the supply voltage $V_B$. A choke coil L is connected between the juncture of the resistors $R_4$ and $R_5$ and that terminal of the secondary winding 3 which is not connected to the base of transistor $T_2$. This choke coil L is a low-ohmic impedance for direct currents and a very high-ohmic impedance for alternating currents. The output circuit of the push-pull output stage connected across terminals A and B comprises three serially connected resistors $R_1$, $R_2$, $R_3$, and an output transformer $U_2$ whose primary winding 4 is connected in parallel with resistors $R_1$ and $R_2$ and whose secondary winding 5 has its output terminals $c$ and $d$ connected across the load resistance $R_L$ so that the latter has an output voltage $V_{out}$ applied thereacross. The combined negative feedback voltage $V_g$, which is dependent on both current and voltage, is taken across the juncture of resistors $R_1$ and $R_2$ and terminal B, shown as ground. This negative feedback voltage is applied to a damping circuit D which is adjustable to provide a given damping factor $\beta$. The output voltage $\beta V_g$ is connected in series with the input voltage $V_1$ of amplifier $A_1$. Thus, the total control voltage $V_o$ needed across input terminals $a$ and $b$ for the push-pull amplifier as a whole is composed of the sum of the negative feedback voltage $\beta V_g$ and the preamplifier input voltage $V_1$.

The resistors $R_1$, $R_2$, $R_3$, and the internal resistance $R_i$ seen across the terminals A and B may be deemed to constitute a bridge, across one of whose diagonals is connected the primary winding 4 of the output transformer $U_2$, and across whose other diagonal the combined negative feedback voltage $V_g$ is taken. The component of the negative feedback voltage resulting from the output voltage $V_{out}$ is taken across the resistor $R_2$, while the component of the negative feedback voltage resulting from the output current is formed across the resistance $R_3$ through which the current flows in the correct phase relationship.

The above-described circuit has the following drawbacks:

Firstly, the alternating current reference point A of the upper portion of the push-pull output stage incorporating the transistor $T_2$ does not, as is customary, lie at ground potential; instead, the potential of point A is that of the voltage $(n_1/n_2)\cdot V_{out}$ appearing across terminals A and B, $n_1$ and $n_2$ being the number of turns of the primary and secondary windings 4 and 5 of transformer $U_2$, respectively. Therefore, in the case of wide band amplifiers, the capacitance appearing across the upper component of the circuit and ground, which capacitance lies in parallel with the load resistance $R_L$ which is transposed to the primary side of the transformer $T_2$, will unduly limit the upper range of the frequency band to be amplified.

Secondly, the base voltage divider $R_4$, $R_5$, $R_6$, needed to obtain the operating points of the transistors would, in the absence of the choke L and insofar as alternating current is concerned, lie between the points A and B at a value $(R_4\cdot R_5)/(R_4+R_5)$, i.e., the voltage divider would be parallel to the load resistance $R_L$ which is transposed to the primary side of the transformer $T_2$ and would thus represent an undesired load on the output stage of the push-pull amplifier. In order to obtain proper stabilization of the operating points within the range of expected ambient temperature fluctuations, and also to eliminate as much as possible leakage of individual transistors, the voltage divider should be relatively low-ohmic, so that the thus-resulting additional output load of the amplifier is no longer acceptable It is true that this drawback is substantially eliminated by providing the choke coil L. However, in the case of a wide band repeater amplifier which has to operate over a large frequency range, this choke coil has to constitute a very large impedance which, in actual practice, is extremely difficult, if not impossible, to realize.

It is, therefore, an object of the present invention to provide a push-pull amplifier which overcomes the above drawbacks, and with this object in view, the present invention resides in an amplifier in which the common output circuit of the transistors comprises a push-pull output transformer whose secondary winding is connected to the load, which transformer has primary windings that are connected to each other via a series circuit constituted by a capacitor and a resistor. A voltage divider incorporating two resistors is connected to one of the primary windings which is not connected directly to ground. A combined negative feedback voltage is taken across the tap of this voltage divider and ground, which negative feedback voltage is applied to the input of the push-pull output stage or to an input stage via an adjustable damping circuit.

If the amplifier is to operate in Class A, the circuit is so designed that $$R_1\cdot R_2=2R_3'\cdot R_1$$

where $R_1$=the internal resistance of one of the stages of the push-pull amplifier, $R_1, R_2$=the resistances of the individual resistors constituting the voltage divider, and $R_3'$=the resistance obtained by connecting in parallel the resistor of the RC series circuit and the resistances of the resistors of the base voltage divider.

Additional objects and advantages of the present invention will become apparent upon consideration of the following description when taken in conjunction with the accompanying drawings in which:

FIGURE 1, already described above, is a circuit diagram of a prior art push-pull amplifier which inherently possesses certain drawbacks overcome by an amplifier according to the present invention.

Referring once more to the drawings and now to FIGURE 2 thereof in particular, the same shows the voltage $aV_1$ derived from preamplifier $A_1$ as being applied, via secondary windings 2 and 3 of the input transformer $U_1$, to the input circuits of transistors $T_1$ and $T_2$, respectively. The emitter-collector paths of these transistors are connected, via the emitter resistances $R_{E1}$ and $R_{E2}$ and the two primary windings 4′ and 4″ with which the output transformer $U_2$ is provided, in a series circuit through which direct current can flow. The D.C. operating points of the two transistors are determined by means of a base voltage divider which lies across the supply voltage $V_B$, this voltage divider incorporating the resistors $R_7$, $R_8$, and $R_9$. The voltage drop across resistor $R_9$ determines primarily the current flowing though the two transistors, while the potential difference between the juncture M of resistors $R_7$ and $R_8$ and the point N, which is that terminal of resistor $R_{E2}$ that is not connected to the emitter of transistor $T_2$—this potential difference being set by means of the resistor $R_8$—determines the voltage distribution of the two transistors. Resistors $R_{E1}$ and $R_{E2}$ are two resistors which are connected in the emitter branches of transistors $T_1$ and $T_2$, respectively, and which bring about a direct current negative feedback of the two transistors and therefore stabilize the operating points of these transistors despite fluctuations in the ambient temperature, the supply voltage, and transistor leakage. Insofar as the resistors $R_{E1}$ and $R_{E2}$ are not bypassed by alternating current, they also bring about an alternating current negative feedback for the useful signal of the respective stage.

The common output circuit of the transistors comprises the output transformer $U_2$ to which the load $R_L$ is connected, the primary windings 4′ and 4″ of which transformer are serially connected via capacitor $C_3$ and resistor $R_3$. Winding 4′ is grounded while winding 4″ is not. Connected across the ungrounded winding 4″ is a voltage divider constituted by the two resistances $R_1$ and $R_2$. These resistors as well as the impedance of the series circuit $C_3R_3$ and the internal resistance of the amplifier circuit constitute the branches of a bridge circuit, one of the diagonals of this bridge being connected across the winding 4″ and the other diagonal being the one across which the combined negative feedback voltage is taken off.

Figure 2:
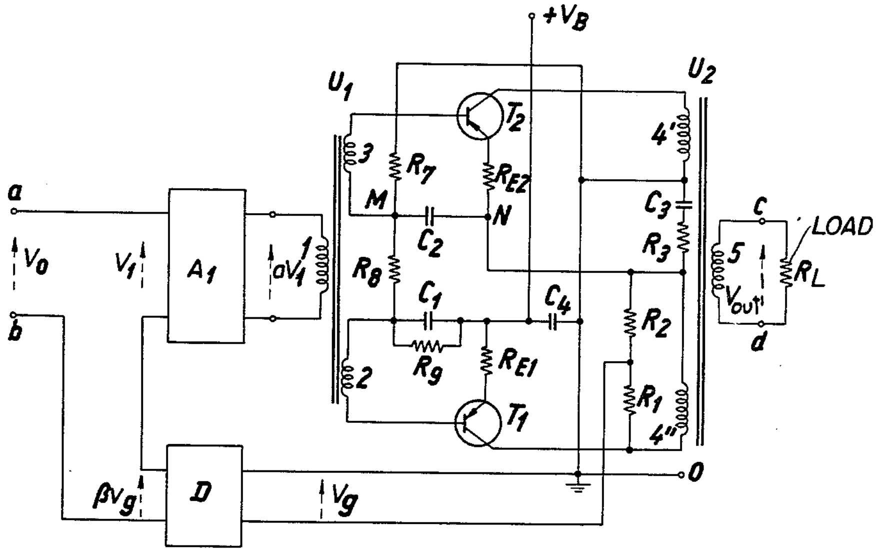
FIGURE 2 is a circuit diagram of one embodiment of a push-pull amplifier according to the present invention.
Figure 3:
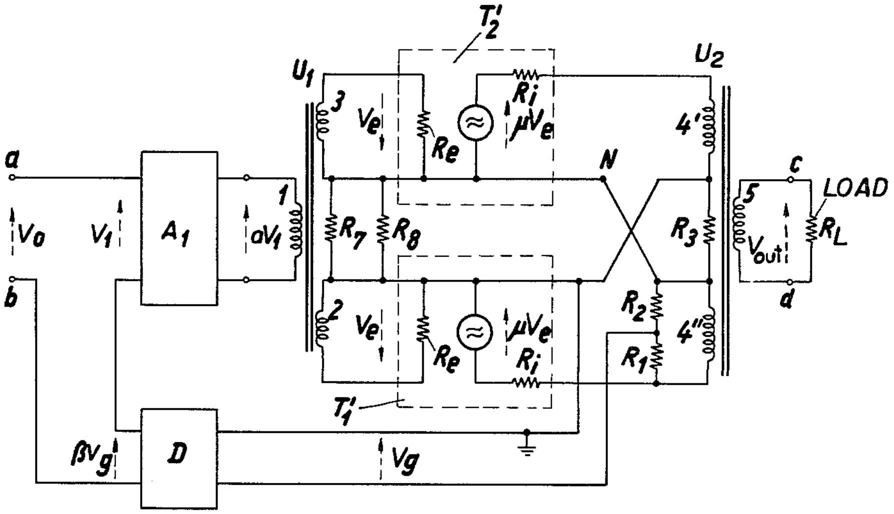
FIGURE 3 is an equivalent circuit diagram of the amplifier of FIGURE 2 for alternating current.

For purposes of explaining effects of the alternating current while the circuit of FIGURE 2 operates as a Class A amplifier, FIGURE 3 is an equivalent circuit diagram which shows only the components affecting the alternating current, with the transistors being replaced by respective equivalent circuits $T_1'$ and $T_2'$, each containing in its input circuit a resistor $R_e$. The output circuit of each equivalent transistor circuit is represented by a voltage $\mu V_e$ which is controlled by the voltage drop $V_e$ across the input resistor $R_e$ and the internal resistance $R_i$ which is in series with this voltage $\mu V_e$. The reactance of the capacitors $C_1$, $C_2$, $C_3$, $C_4$, should be small as compared to the resistances which are in series or in parallel therewith so that the capacitors can be considered, for all practical purposes, as short circuits for the alternating currents involved. Consequently, the capacitors $C_2$, $C_3$ and $C_4$, as well as the capacitor $C_1$ and the resistor $R_9$ across which it is connected, will be considered as nonexistent for purposes of analyzing the alternating current.

Figure 1:
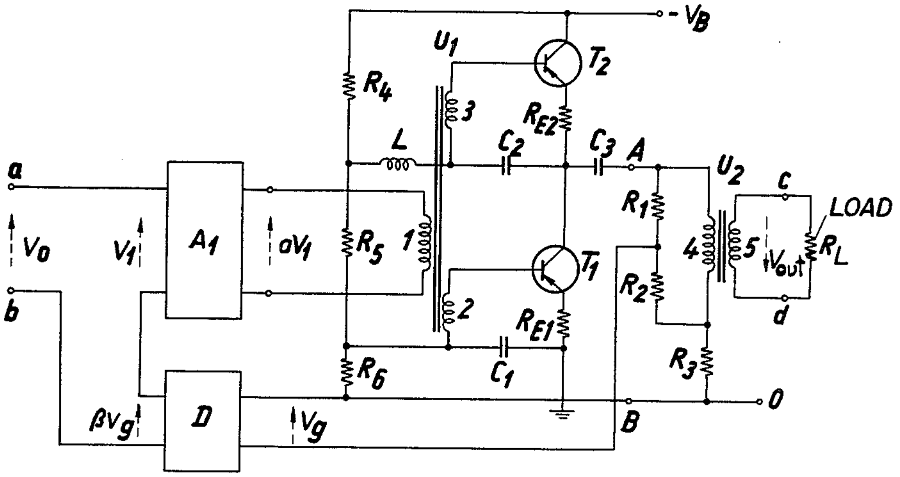
PRIOR ART Fig. 1

It is apparent from FIGURE 3 that, insofar as alternating current is concerned, the reference point N of transistor $T_2$ of the upper component will be above ground potential only by the relatively small potential drop occasioned by the three parallelly connected resistors $R_3$, $R_7$ and $R_8$. This, in contradistinction to the potential of point N in the circuit of FIGURE 1. Circuit capacitances which appear between the upper portion of the circuit and ground will be in parallel only to the resistance $R_3'$, which is the resistance obtained from connecting the resistors $R_3$, $R_7$ and $R_8$ in parallel, $R_3'$ being very much smaller than the comparable resistance of the prior art circuit depicted in FIGURE 1. The cut-off frequency of the amplification is therefore substantially higher. The output load caused by the base voltage divider $R_7$, $R_8$, $R_9$, is thus eliminated inasmuch as the parallel connection of the resistors $R_7$ and $R_8$ of the base voltage divider can be incorporated into the resulting current negative feedback resistance $R_3'$. The useful alternating currents of the two transistors operating in Class A, push-pull, flow through the resulting resistance in correct phase relation. The voltage drop across $R_3'$ represents that component of the negative feedback voltage which is proportional to the current of the two transistors. The component of the negative feedback voltage which is proportional to the output voltage is taken off across the resistor $R_2$, which last-mentioned voltage comes, via the windings 4′ and 4″ of the output transformer $U_2$, also from the stages $T_2$ and $T_1$ of the push-pull circuit.

The impedance $Z_b$ seen across the output terminals *c* and *d* is independent of the magnitude of the negatively fed back voltage $\beta V_g$ if $$R_i \cdot R_2 = 2R_3' \cdot R_1$$

The value of $Z_b$ is then $$Z_b = 4\left(\frac{n_2}{n_1}\right)^2 \cdot \frac{(R_1+R_2)\cdot\left(\frac{R_i}{2}+R_3'\right)}{R_1+R_2+R_3'+\frac{R_i}{2}}$$

where $n_2$ is the number of turns of the secondary winding of the output transformer $U_2$ and $n_1$ is the sum of the number of turns of the two primary windings, each primary winding having the same number of turns.

The over-all amplification *a* of the amplifier as a whole is $$a = a_o/(1+Ka_o)$$

from which it is seen that the amplification *a* varies when the negative feedback factor K is varied by means of $\beta$. $a_o$ is the over-all amplification of the amplifier without negative feedback, while K is a function of $\beta$.

Figure 4:
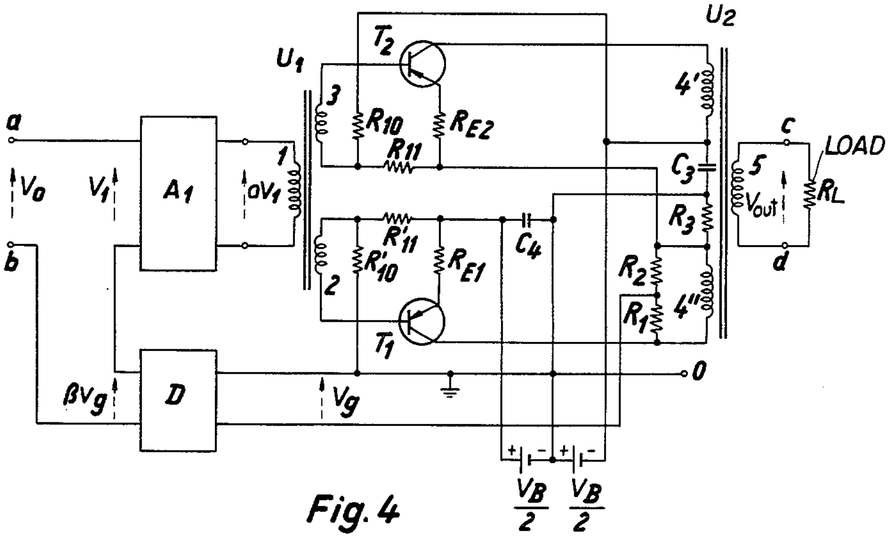
FIGURE 4 is a circuit diagram of another embodiment of a push-pull amplifier according to the present invention.

The embodiment of FIGURE 4 may be used when the push-pull output stages are to operate not only in Class A but also in Class B or Class C, and when the output impedance is to remain independent of changes in the amplification as a result of changes in the negative feedback.

The circuit of FIGURE 4 differs from that of FIGURE 2 in that the source of operating voltage is provided with a center tap which is connected with the juncture of capacitor $C_3$ and resistor $R_3$. The transistors are driven separately, each with half the supply voltage or ½$V_B$. In this arrangement, it is expedient to adjust the operating point of each transistor separately by means of resistors $R_{10}$, $R_{11}$, and $R_{10}'$, $R_{11}'$, respectively, each pair of resistors being connected as voltage dividers across one-half of the supply voltage. It will be noted that, since the capacitor $C_3$ is, effectively, a short-circuit for alternating current, the winding 4' is still a grounded winding insofar as alternating current is concerned.

In the case of pure Class A operation, the amplification can be increased by short-circuiting the resistors $R_{11}$, $R_{11}'$, and $R_{E1}$, $R_{E2}$, insofar as alternating current is concerned, by means of capacitors. In the case of pure Class B operation, it is expedient to make each of the resistors $R_{10}$ and $R_{10}'$ equal to infinity, and to make each of the resistors $R_{11}$ and $R_{11}'$ equal to zero.

The output impedance $Z_b$, measured across the points $c$ and $d$, is, in the case of Class B and Class C operation, independent of change in amplification in the negative feedback path by means of $\beta$ if $$R_i \cdot R_2 = R_1 \cdot R_3''$$

where $R_3''$ is the resistance obtained from connecting in parallel the resistor $R_3$ and the series circuit of resistors $R_{10}$ and $R_{11}$. The value of $Z_b$ will then be $$Z_b = \left(\frac{n_2}{n_1}\right)^2 \cdot \frac{(R_1+R_2)\cdot(R_i+R_3'')}{R_i+R_1+R_2+R_3''}$$

For Class A operation, $Z_b$ remains constant if $$R_i \cdot R_2 = 2R_3'' \cdot R_1$$

where $$Z_b = 4\left(\frac{n_2}{n_1}\right)^2 \cdot \frac{(R_1+R_2)\cdot\left(\frac{R_i}{2}+R_3''\right)}{R_1+R_2+R_3''+\frac{R_i}{2}}$$

It will be seen from the above that, in each of the illustrated embodiments, the output transformer $U_2$ has an ungrounded primary winding 4'' and a primary winding 4' which is grounded at least insofar as alternating current is concerned; in the circuit of FIGURE 2 the winding 4' is grounded directly while in the circuit of FIGURE 4 the winding 4' is grounded, insofar as alternating current is concerned, via the capacitor $C_3$. The negative feedback voltage is then derived from across ground and the tap of the voltage divider connected across the ungrounded winding 4'', i.e., the juncture of the resistors $R_1$ and $R_2$.

It will be understood that the above description of the present invention is susceptible to various modifications, changes, and adaptations, and the same are intended to be comprehended within the meaning and range of equivalents of the appended claims. For example, the transistors may, instead of being connected in common-emitter configuration as shown in the drawings, be connected in common-base or in common-collector configuration.

Figure 5:
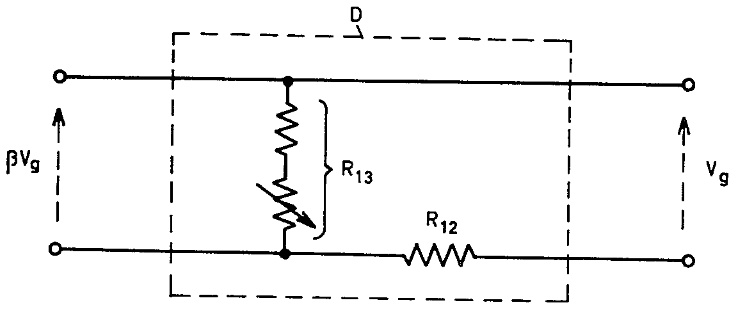
FIGURES 5 and 6 are circuit diagrams of typical damping circuits which are used in the amplifier according to the present invention, these damping circuits per se being conventional.
Figure 6:
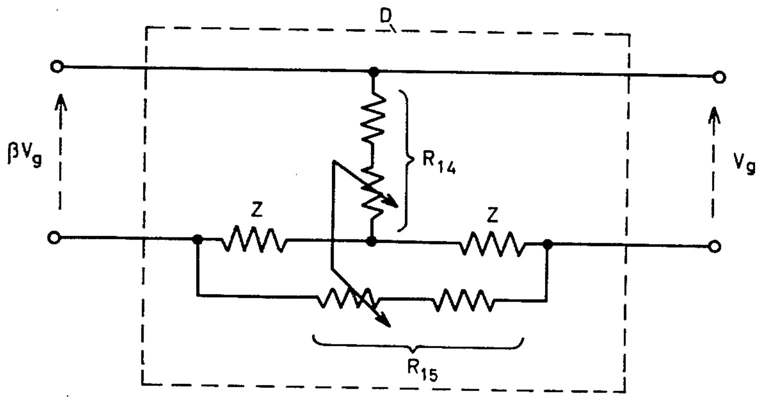

The damping circuit D mentioned above is conventional, but for reference purposes, two typical damping circuits are shown in FIGURES 5 and 6.

The damping circuit of FIGURE 5 is fashioned as a voltage divider comprising a fixed series resistor $R_{12}$ and a shunt transistor $R_{13}$ which, either in whole or in part, is capable of being varied either continuously or in a stepwise manner. In order to obtain a frequency dependent feedback, the resistors $R_{12}$ and $R_{13}$ may be fashioned as complex two-terminal circuits.

The damping circuit shown in FIGURE 6 is fashioned as a shunted T-circuit comprising two similar ohmic resistors Z and two further resistors $R_{14}$ and $R_{15}$, the former being a shunt resistor and the latter being connected across the resistors Z. Each of the two resistors $R_{14}$ and $R_{15}$ is capable of being varied, either in whole or in part, and either continuously or in a step-wise manner, the relationship between the resistors in the circuit of FIGURE 5 being $$R_{14} \cdot R_{15} = Z^2$$

Here, too, the resistors $R_{14}$ and $R_{15}$ may, in order to provide a frequency dependent feedback, be fashioned as complex two-terminal circuits.

What is claimed is:

1. In a push-pull transistor amplifier provided with combined current and voltage negative feedback and incorporating an input transformer having a primary and two secondary windings, and two transistors which are connected in a series circuit through which direct current can flow, which transistors have input circuits connected to said two secondary windings, respectively, the improvement which comprises a common output circuit for said transistors, said output circuit incorporating:

(a) an output transformer having two primary windings connected to output circuits of said transistors, respectively, one of said two primary windings being ungrounded and the other being grounded at least insofar as alternating current is concerned;

(b) a series circuit composed of a capacitor and a resistor, said series circuit interconnecting said two primary windings of said output transformer;

(c) a voltage divider connected across said ungrounded primary winding; and (d) means for deriving from across a tap on said voltage divider and ground a combined current and voltage negative feedback voltage and applying the same to the primary winding of the input transformer of the amplifier.

2. A push-pull transistor amplifier provided with combined current and voltage negative feedback, and comprising, in combination:

(a) an input transformer having a primary and two secondary windings;

(b) two transistors which are connected in a series circuit through which direct current can flow, said transistors having input circuits connected to said secondary windings, respectively;

(c) an output transformer having two primary windings connected to output circuits of said transistors, respectively, one of said two primary windings of said output transformer being ungrounded and the other being grounded at least insofar as alternating current is concerned;

(d) a series circuit composed of a resistor and a capacitor, said series circuit interconnecting said two primary windings of said output transformer;

(e) a voltage divider composed of two serially connected resistors, said voltage divider being connected across said undergrounded primary winding of said output transformer; and (f) means for deriving from across the juncture of said two resistors of said voltage divider and ground a combined current and voltage negative feedback voltage and applying the same to said primary winding of said input transformer.

3. A push-pull amplifier as defined in claim 2 wherin said means include a pre-amplifier stage having its output connected to said primary winding of said input transformer, and an adjustable damping circuit for applying said feedback voltage to said preamplifier stage.

4. A push-pull amplifier as defined in claim 2, further comprising a voltage divider connected across said transistors for determining the operating points thereof.

5. A push-pull amplifier as defined in claim 4 wherein said voltage divider connected across said undergrounded primary winding of said output transformer includes resistors $R_1$ and $R_2$, wherein said voltage divider connected across said transistors include resistors $R_7$ and $R_8$, and wherein, for Class A operation, $$R_i \cdot R_2 = 2R_3' \cdot R_1$$

where $R_i$=the internal resistance of one stage of the amplifier, and $R_3'$=the resistance obtained by connecting in parallel said resistor of said series circuit interconnecting said two primary windings of said output transformer, and said resistors $R_7$ and $R_8$.

6. A push-pull amplifier as defined in claim 2, further comprising a source of supply voltage provided with a center tap which is connected with the juncture of said capacitor and said resistor of said series circuit interconnecting said two primary windings of said output transformer, and means for applying one-half of the supply voltage to one of said transistors and the other half of the supply voltage to the other of said transistors.

7. A push-pull amplifier as defined in claim 6 wherein said means for applying supply voltage to each of said transistors includes a voltage divider incorporating two serially connected resistors.

8. A push-pull amplifier as defined in claim 7 wherein, for Class A operation, $$R_i \cdot R_2 = 2R_3'' \cdot R_1$$

where $R_i$=the internal resistance of one stage of the amplifier, $R_1$, $R_2$=the resistance of said resistors of said voltage divider connected across said undergrounded primary winding of said output transformer, and $R_3''$=the resistance obtained by connecting in parallel, firstly, said resistor of said series circuit interconnecting said two primary windings and secondly, the series circuit of the two resistors forming the voltage divider for the transistor which is connected across said undergrounded primary winding of said output transformer.

9. A push-pull amplifier as defined in claim 7 wherein, for Class B or Class C operation, $$R_i \cdot R_2 = R_3'' \cdot R_1$$

where $R_i$=the internal resistance of one stage of the amplifier, $R_1$, $R_2$=the resistance of said resistors of said voltage divider connected across said ungrounded primary winding of said output transformer, and $R_3''$=the resistance obtained by connecting in parallel firstly, said resistor of said series circuit interconnecting said two primary windings and secondly, the series circuit of the two resistors forming the voltage divider for the transistor which is connected across said ungrounded primary winding of said output transformer.

10. A push-pull amplifier comprising, in combination:

(a) an input transformer having a primary winding and two secondary windings;

(b) an output transformer having two primary windings and a secondary winding to which a load may be connected;

(c) two transistors each having an input circuit and an output circuit, each transistor input circuit including a capacitor and being connected across a respective one of said input transformer secondary windings, the output circuit of one of said transistors being connected across one of said output transformer primary windings and the output circuit of the other of said transistors including a further capacitor and being connected across the other of said output transformer primary windings;

(d) a capacitor $C_3$ having one terminal connected to one terminal of said one primary winding of said output transformer;

(e) a resistor $R_3$ having one terminal connected to the other terminal of said capacitor $C_3$, the other terminal of said resistor $R_3$ being connected to one terminal of said other primary winding of said output transformer;

(f) a further resistor connected across (1) the juncture of said capacitor $C_3$ with said one primary winding of said output transformer and (2) the juncture of the capacitor in the input circuit of said one transistor with the input transformer secondary winding to which such last-mentioned capacitor is connected;

(g) a further resistor connected across (1) said juncture set forth in (f)(2) and (2) the juncture of the capacitor in the input circuit of said other transistor with the input transformer secondary winding to which such last-mentioned capacitor is connected;

(h) a further resistor connected across said last-mentioned capacitor;

(i) a voltage divider incorporating two serially connected resistors and connected across said other primary winding of said output transformer;

(j) means connected across (1) the juncture of said capacitor $C_3$ with said one primary winding of said output transformer and (2) the juncture of said two serially connected resistors of said voltage divider for deriving a combined current and voltage negative feedback voltage and applying the same to said input transformer primary winding; and (k) means for applying a supply voltage across the capacitor in said output circuit of said other transistor.

11. A push-pull amplifier as defined in claim 10 wherein said means (j) include a pre-amplifier stage having its output connected to said primary winding of said input transformer, and an adjustable damping circuit for applying said feedback voltage to said pre-amplifier stage.

12. A push-pull amplifier comprising, in combination:

(a) an input transformer having a primary winding and two secondary windings;

(b) an output transformer having two primary windings and a secondary winding to which a load may be connected;

(c) two transistors each having an input circuit and an output circuit, each transistor input circuit including a resistor and being connected across a respective one of said input transformer secondary windings, the output circuit of one of said transistors being connected across one of said output transformer primary windings and the output circuit of the other of said transistors including a capacitor and being connected across the other of said output transformer primary windings;

(d) a capacitor $C_3$ having one terminal connected to one terminal of said one primary winding of said output transformer;

(e) a resistor $R_3$ having one terminal connected to the other terminal of said capacitor $C_3$, the other terminal of said resistor $R_3$ being connected to one terminal of said other primary winding of said output transformer;

(f) a resistor connected across (1) the juncture of said capacitor $C_3$ with said one primary winding of said output transformer and (2) the juncture of the resistor in the input circuit of said one transistor with the input transformer secondary winding to which such last-mentioned resistor is connected;

(g) a further resistor connected across (1) the juncture of said capacitor $C_3$ with said resistor $R_3$ and (2) the juncture of the resistor in the input circuit of said other transistor with the input transformer secondary winding to which such last-mentioned resistor is connected;

(h) a voltage divider incorporating two serially connected resistors and connected across said other primary winding of said output transformer;

(i) means connected across (1) said juncture set forth in (g)(1) and (2) the juncture of said two serially connected resistors of said voltage divider for deriving a combined current and voltage negative feedback voltage and applying the same to said input transformer primary winding; and (j) means for applying one-half of a supply voltage across the capacitor in said output circuit of said other transistor and the other half of the supply voltage across said capacitor $C_3$.

13. A push-pull amplifier as defined in claim 12 wherein said means (i) include a preamplifier stage having its output connected to said primary winding of said input transformer, and an adjustable damping circuit for applying said feedback voltage to said preamplifier stage.

References Cited by the Examiner

UNITED STATES PATENTS 2,777,019 1/1957 Morrison ---------- 330—102

ROY LAKE, *Primary Examiner.*

NATHAN KAUFMAN, *Examiner.*

F. D. PARIS, *Assistant Examiner.*